United States Patent
McFeely et al.

[11] Patent Number: 6,017,401
[45] Date of Patent: Jan. 25, 2000

[54] CONDUCTIVITY IMPROVEMENT IN THIN FILMS OF REFRACTORY METAL

[75] Inventors: Fenton Read McFeely, Ossining; Ismail Cevdet Noyan, Yorktown Heights, both of N.Y.; John Jacob Yurkas, Stamford, Conn.

[73] Assignee: International Business Machines Corporation, Armonk, N.Y.

[21] Appl. No.: 09/170,622

[22] Filed: Oct. 13, 1998

[51] Int. Cl.[7] .................................................. C23C 8/06

[52] U.S. Cl. ..................... 148/279; 148/281; 148/217; 148/223; 148/422; 428/665

[58] Field of Search .................................. 148/279, 281, 148/284, 95, 217, 223, 422; 428/662, 665; 264/101; 427/250, 251, 252

[56] References Cited

U.S. PATENT DOCUMENTS

| | | | |
|---|---|---|---|
| 4,579,752 | 4/1986 | Dubois et al. | 148/284 |
| 4,668,530 | 5/1987 | Reif et al. | 427/255 |

*Primary Examiner*—John Sheehan
*Assistant Examiner*—Andrew L. Oltmans
*Attorney, Agent, or Firm*—McGinn & Gibb, P.C.

[57] ABSTRACT

A method of increasing conductivity of a refractory metal film disposed upon a substrate includes exposing the refractory metal film to an atmosphere comprising a silane of the form $Si_nH_{(2n+2)}$, where n is a positive integer, while subjecting the refractory metal film to a temperature in excess of 700 degrees Celsius and to a base pressure not exceeding $10^{-8}$ torr for a time period which is chosen to be sufficiently long to increase the conductivity of the refractory metal film to a correspondingly sufficient degree.

17 Claims, 1 Drawing Sheet

CONDUCTIVITY IMPROVEMENT IN THIN FILMS OF REFRACTORY METAL

BACKGROUND OF THE INVENTION

I. Field of the Invention

The present invention relates to thin films of refractory metal disposed upon substrates, and more particularly, to a method for the improvement of the conductivity of such refractory metal thin films.

II. Prior Art

Thin films of refractory metals are typically deposited on insulating and semiconductor substrates (e.g. silicon) by either sputtering or chemical vapor deposition (CVD). The tools employed for the sputter depositions typically have only "moderate" base pressures upon evacuation, typically greater than $1 \times 10^{-7}$ torr pressure. Accordingly when the metal selected is sputter deposited onto the substrate, small but significant amounts of oxygen, originating from the moderate-vacuum environment, either directly from the ambient or from the sputter target, are incorporated into the film, typically at grain boundaries. The identical process may also occur in films produced by CVD in a moderate vacuum reactor. Additionally in some cases the oxygen may be introduced via oxygen atoms present in the CVD precursor molecules themselves or via oxygen containing impurities in a carrier gas. The effect of the oxygen impurity in the films is to increase the resistivity of the films, which is a highly undesirable feature for many applications.

SUMMARY OF THE INVENTION

Broadly, the present invention provides a method of increasing conductivity of a refractory metal film disposed upon a substrate, the novel method comprising the steps of:

a) placing said metal film in a vacuum chamber with a base pressure not exceeding $10^{-8}$ torr, b) exposing the metal film to an atmosphere comprising a silane of the form $Si_nH_{(2n+2)}$, where n is a positive integer and c) during step b), subjecting the refractory metal film to a temperature in excess of 700 degrees Celsius for a time period sufficient to increase the conductivity of said refractory metal film to a correspondingly sufficient degree.

It appears that there is a synergistic effect of steps (b) and (c). Exposing the films to silane gas at room temperature, the application of step (b) without step (c), appears to have no effect. Annealing, as the application of step (c) without step (b) is believed to improve film conductivity to a limited degree. However, as discussed hereinbelow, the application of steps (b) and (c) together produces a still greater improvement in the conductivity.

Preferably, where the refractory metal film comprises trace oxygen, steps b) and c) are carried out for a time period sufficient to scavenge oxygen from the refractory metal film to increase the conductivity thereof to a correspondingly sufficient degree.

According to a preferred embodiment, the refractory metal film comprises a refractory metal selected from the group consisting of W, Ta, and Nb, and the silane is supplied at a silane pressure not exceeding $10^{(-2)}$ torr.

Preferably, the aforesaid time period is between 1 and 10 minutes and said temperature is between 800 and 900 degrees Celsius.

BRIEF DESCRIPTION OF THE DRAWING

This invention will be better understood from the accompanying drawing, wherein.

DETAILED DESCRIPTION

Figure 1:
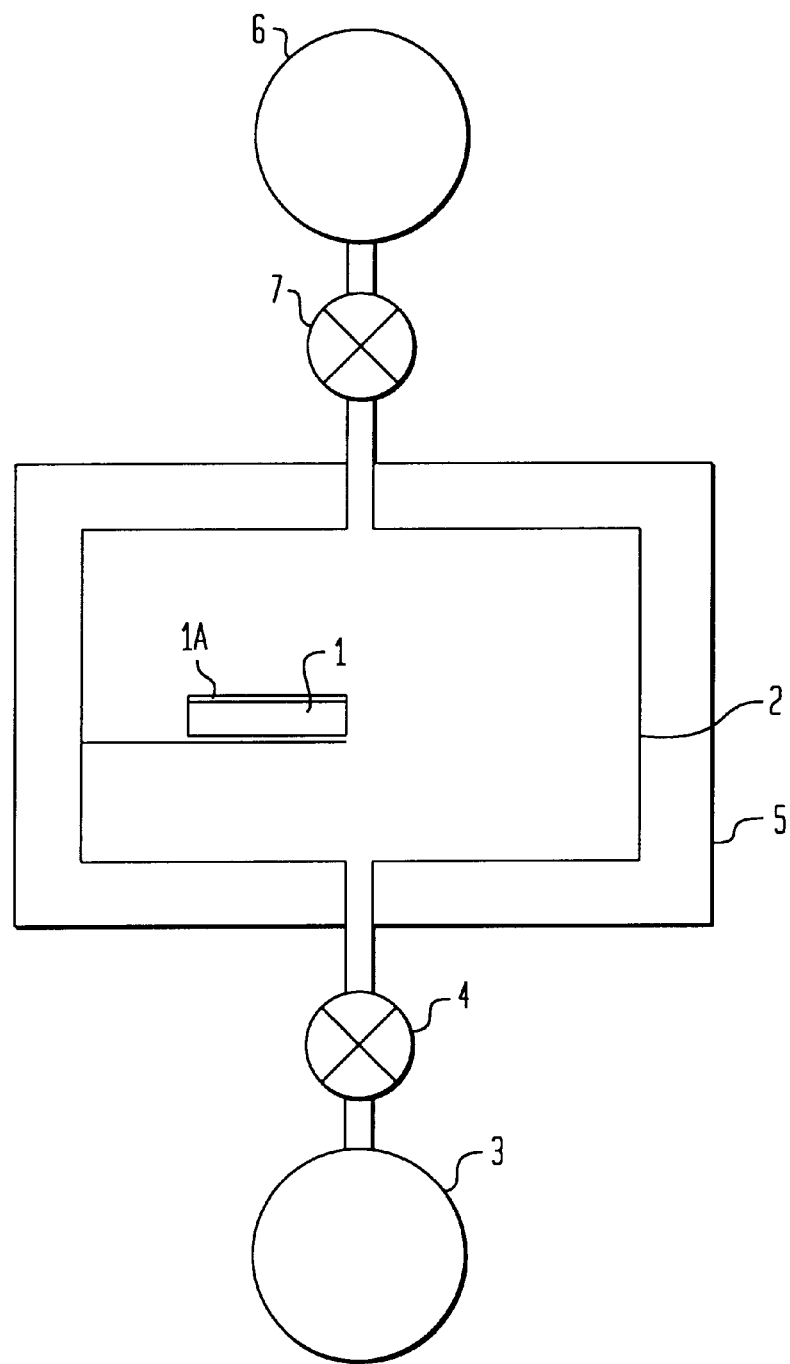
FIG. 1 is a schematic diagram of an apparatus for increasing the conductivity of a refractory metal film in accordance with sputter the invention.

As shown in FIG. 1, a substrate 1 having a refractory metal film 1A disposed on its surface is placed in a vacuum chamber 2, which is maintained at a base pressure not exceeding $10^{-8}$ torr by pump 3 and valve 4. As can be seen, oven 5 encloses vacuum chamber 2 to permit heating thereof to high temperatures (e.g. in excess of 700 degrees Celsius). A silane gas such as $SiH_4$ is introduced from a silane source 6 via valve 7 into vacuum chamber 2 in order to expose substrate 1 and its refractory metal film to a silane atmosphere. While exposed to the silane atmosphere, the temperature of the oven 5 and the enclosed substrate 1 is maintained at a high temperature (e.g. 850 degrees Celsius) for 1 to 10 minutes.

Mechanism of Operation

It is believed that the improvement in film conductivity is effected by the operation of two distinct chemical reactions. The optimization of the method for a particular metal is governed by the adjustment of the factors which separately govern the rates of these two reactions.

Reaction 1 is the reaction of the silane with the metal at the surface of the metal film to produce a metal silicide (for example, $Ta + 2SiH_4 = TaSi_2 + 4H_2$). In the initial few seconds of the process a negligibly thin film of the silicide a few atomic layers thick may be formed at the surface. If this were the only reaction occurring, the net effect of continued processing on the conductivity would be deleterious, as the sample would simply be slowly converted into the metal silicide, which has poorer conductivity.

Reaction 2, which is the key to the process, is the reaction of the silicon, which was introduced into the surface of the metal film as metal silicide via reaction 1, with the oxygen originally present in the film (which reaches the surface layer via random diffusion). This reaction converts the silicon in the silicide to silicon oxide, which is volatile at the temperature employed and is thus desorbed (as SiO) and pumped away under the low base pressure conditions, effecting the removal of oxygen in the sample. The processing conditions are preferably chosen such that the rate of removal of Si from the surface of the sample as SiO via reaction 2 roughly balances its introduction into the sample as a metal silicide via reaction 1. If this is done there is no growth of the metal silicide layer beyond a negligible few atomic layers and the result is a metal film free of oxygen contamination which exhibits improved conductivity.

It is believed that it is not absolutely necessary that the nascent silicon dioxide produced by reaction 2 be volatilized as SiO. If a lower temperature were employed such that the SiO remained on the surface, the resulting layer of oxide might be removed by chemical or mechanical means, however we do not consider this to be the preferred embodiment of the invention.

Optimization and Control of the Process

The silane partial pressure and the substrate temperature can be adjusted to optimize the foregoing process for a particular metal or alloy. The rate of reaction 1 can be increased or decreased by increasing or decreasing (respectively) the partial pressure of the silane. The rate of reaction 2 is primarily governed by the diffusion rate of oxygen in the metal film. This can be increased or decreased, respectively by increasing or decreasing the substrate temperature. Depending upon the partial pressure of the silane selected, changing the substrate temperature may or may not change the rate of reaction 1. Processing time will be chosen so as to effectively scavenge all of the oxygen from the film. This will in turn depend upon the silane pressure, the substrate temperature, the chemical identity of the film, and the film thickness. For a given type of sample, the process may be optimized to the desired degree by parametric studies (intelligent trial and error guided by the above principles). It is also amenable to dynamical real-time control via spectroscopic monitoring of the nascent SiO product.

APPLICABILITY

With proper optimization the vast majority of the refractory metals and alloys of such metals should be suitable for this process. It is believed that the only absolute requirement is that the oxygen affinity of the Silicon is sufficient to compete chemically with the metal film for the incorporated oxygen, such that reaction 2 can take place, and that the structure to be processed should withstand being heated to the necessary temperature in excess of about 700 degrees Celsius in the presence of the silane. Typically, the substrates bearing the metal films could be of silicon, silicon nitride, silicon dioxide quartz or a high quality glass, sapphire, any high temperature composite ceramic, or any other like material, or a combination of such materials.

II. Detailed Examples

A. Implementation for Sputter Deposited Films

Approximately 50 nm of each of Ta and Nb were each deposited on a silicon dioxide coated silicon wafer. After the deposition, the resistivity of each film was measured and the wafers were split into 2 parts. Then piece 1 of each wafer was placed in an oven at 850 C. under 10 mtorr of silane flowing at 10 std cc/mm for 5 minutes. ("Full Processing") The samples were allowed to cool to room temperature and their resistivities were remeasured. Piece 2 of each sample was given the identical treatment, except that nonreactive Argon was substituted for the silane ("Anneal Only"). This control run makes it possible to distinguish the difference between the full process of the invention and the effect of annealing alone. The results of these measurements are summarized in the table below. Note that Ta and Nb upon full processing showed a reduction in the resistivity substantially greater than that produced by annealing alone (Annealing did not improve the Nb film at all, in fact the resistance rose slightly, perhaps due to chemical interaction with the underlying oxide at the annealing temperature.).

TABLE (of sheet resistances in ohms per square) for Sputter-Deposited Films

| Metal | As Deposited | Anneal Only | Full Processing |
|-------|--------------|-------------|-----------------|
| Ta    | 39.6         | 10.8        | 6.1             |
| Nb    | 7.2          | 7.9         | 5.2             |

Implementation for CVD Deposited Films

A different procedure was used to evaluate W films grown by CVD (chemical vapor deposition) from $W(CO)_6$, in order to directly verify the oxygen scavenging mechanism described above under the heading "Mechanism of Operation". Films of identical thickness (approximately 700 Angstroms) were grown. Film 1 was grown in an ultrahigh vacuum reactor (base pressure $1 \times 10^{(-91)}$ torr) so as to rigorously exclude oxygen from the film. Film 2 was grown by the identical procedure, except that a partial pressure of $1 \times 10^{(-5)}$ torr of molecular oxygen was admitted into the reactor during film growth by means of a separate variable leak valve connected to a cylinder of high purity oxygen. The resistivity of film 2 was found to be approximately twice as high as film 1. Film 2 was then treated with silane at 850 degrees Celsius as described above for the ed films. After this treatment the resistivity of film 2 had dropped to a value that was equal to that of film 1 within experimental uncertainty, indicating that all of the deliberately introduced oxygen had been scavenged from the film.

While the present invention has been described with reference to preferred embodiments thereof in order to facilitate a better understanding of the invention, those skilled in the art will recognize that the invention can be embodied in various ways without departing from the scope and spirit of the invention as set forth in the appended claims.

What is claimed is:

1. A method of increasing conductivity of a refractory metal film disposed upon a substrate to a desired degree, said method comprising:
   a) placing said metal film in a vacuum chamber with a base pressure not exceeding $10^{-8}$ torr;
   b) exposing said refractory metal film to an atmosphere comprising a silane of the form $Si_nH_{(2n+2)}$, where n is a positive integer; and
   c) during said exposing, subjecting said refractory metal film to a temperature in excess of 700 degrees Celsius for a time period sufficient to increase the conductivity of said refractory metal film to said desired degree.

2. A method of increasing conductivity of a refractory metal film disposed upon a substrate to a desired degree, said refractory metal film comprising trace oxygen, said method comprising:
   a) placing said metal film in a vacuum chamber with a base pressure not exceeding $10^{-8}$ torr;
   b) exposing said refractory metal film to an atmosphere comprising a silane of the form $Si_nH_{(2n+2)}$, where n is a positive integer; and
   c) during step said exposing, subjecting said refractory metal film to a temperature in excess of 700 degrees Celsius for a time period sufficient to scavenge oxygen from said refractory metal film to increase the conductivity of said refractory metal film to said desired degree.

3. A method as set forth in claim 1, wherein said refractory metal film comprises a refractory metal selected from the group consisting of W, Ta, and Nb.

4. A method as set forth in claim 1, wherein said silane is supplied at a silane pressure not exceeding $10^{(-2)}$ torr.

5. A method as set forth in claim 1, wherein said time period is between 1 and 10 minutes and said temperature is between 800 and 900 degrees Celsius.

6. A method as set forth in claim 2, wherein said refractory metal film comprises a refractory metal selected from the group consisting of W, Ta, and Nb.

7. A method as set forth in claim 2, wherein said silane is supplied at a silane pressure not exceeding $10^{(-2)}$ torr.

8. A method as set forth in claim 2, wherein said time period is between 1 and 10 minutes and said temperature is between 800 and 900 degrees Celsius.

9. The method as set forth in claim 3, wherein said time period is between 1 and 10 minutes and said temperature is between 800 and 900 degrees Celsius, and wherein said silane is supplied at a silane pressure between $10^{-4}$ and $10^{-2}$ torr.

10. The method as set forth in claim 6, wherein said time period is between 1 and 10 minutes and said temperature is between 800 and 900 degrees Celsius, and wherein said silane is supplied at a silane pressure between $10^{-4}$ and $10^{-2}$ torr.

11. The method as set forth in claim 1, wherein silicon is used to scavenge residual oxygen in the refractory metal film and to remove said residual oxygen from the metal film by desorbing from a surface of said refractory metal film as SiO.

12. The method as set forth in claim 1, wherein said exposing comprises a reaction of a silicide, formed by a reaction of the silane with the metal film, with oxygen initially dissolved in the metal film, and a desorption of silicon in the silicide and the oxygen from the metal film as SiO.

13. The method as set forth in claim 12, wherein said subjecting uses said temperature in excess of 700 degrees Celsius such that the SiO is volatile, and such that the dissolved oxygen is mobile to reach a surface of the metal film at a rate to prevent buildup of excess silicide.

14. The method as set forth in claim 1, wherein a reactor is used with a base pressure not exceeding $10^{-2}$ torr for minimizing exposure of the metal film to oxygen during said exposing.

15. The method as set forth in claim 2, wherein silicon is used to scavenge residual oxygen in the refractory metal film and to remove said residual oxygen from the metal film by desorbing from the surface as SiO.

16. The method as set forth in claim 2, wherein said exposing comprises a reaction of a silicide, formed by a reaction of the silane with the metal film, with oxygen initially dissolved in the metal, and a desorption of silicon in the silicide and the oxygen from the metal film as SiO.

17. The method as set forth in claim 16, wherein said subjecting uses said temperature in excess of 700 degrees Celsius such that the SiO is volatile, and such that the dissolved oxygen is mobile to reach a surface of the metal film at a rate to prevent buildup of excess silicide.

* * * * *